June 26, 1962 F. V. ADAMTHWAITE, JR., ET AL 3,041,552
FREQUENCY CONTROLLED OSCILLATOR UTILIZING
A TWO TERMINAL SEMICONDUCTOR
NEGATIVE RESISTANCE DEVICE
Filed Dec. 19, 1960 2 Sheets-Sheet 1

INVENTORS:
FRANK V. ADAMTHWAITE,
CHANG S. KIM,

BY Dudley T. Ready
THEIR AGENT.

INVENTORS:
FRANK V. ADAMTHWAITE,
CHANG S. KIM,
BY Dudley J. Ready
THEIR AGENT.

3,041,552

FREQUENCY CONTROLLED OSCILLATOR UTILIZING A TWO TERMINAL SEMICONDUCTOR NEGATIVE RESISTANCE DEVICE

Frank V. Adamthwaite, Jr., North Syracuse, and Chang S. Kim, East Syracuse, N.Y., assignors to General Electric Company, a corporation of New York Filed Dec. 19, 1960, Ser. No. 76,908
6 Claims. (Cl. 331—107)

This invention relates to a frequency controlled oscillator. More particularly, the invention relates to an oscillator utilizing a semiconductor device having a characteristic with a region of negative resistance in the forward direction of bias and preferably using a piezoelectric crystal as the primary frequency selection element. An appropriate device is of the type currently referred to as a "tunnel diode."

Oscillators utilizing two terminal devices having negative resistance, such as the dynatrons, are well known in the art. Unfortunately, these devices have produced problems in maintaining frequency stability. However, an example of an oscillator of excellent stability and utilizing a two terminal semiconductor diode having a negative resistance is disclosed in U.S. patent application, S.N. 858,996, filed December 11, 1959 ("Frequency Controlled Oscillator," by Robert L. Watters), assigned to the same assignee as this application. In this application, a refined bridge circuit incorporating a crystal with provision for proper bias is connected across a suitable diode to provide the frequency controlled oscillator. It has been found that when it is desired to extract substantial energy from the oscillator to a load such as an antenna the diode may have insufficient power capacity for the desired operation. The tunnel diodes, to which the present invention has application, are characteristically low power devices, and accordingly, any increases in power output are highly desirable.

An object of this invention is to provide an oscillator utilizing a two terminal semiconductor device having a negative resistance characteristic which permits increased amounts of energy to be extracted from the oscillator into an A.C. load such as an antenna.

A further object of the invention is to provide an oscillator utilizing a two terminal semiconductor device having a negative resistance characteristic in which the A.C. and D.C. circuits are mutually independent.

Briefly stated, in accordance with one aspect of the invention, a frequency controlled oscillator is provided utilizing a two terminal semiconductor negative resistance device in which the A.C. and D.C. circuits are effectively independent. An inductor in series with bias means is connected across the semiconductor device. The bias means are comprised of a D.C. voltage source and a series resistor selected to bias the semiconductor device into a region of negative resistance. An element, series resonant at the desired frequency of oscillation, is connected in shunt with the bias means. This element is preferably a piezoelectric crystal. A tank circuit is provided by connecting a capacitor in parallel with the inductor in such a manner as to provide parallel resonance at the desired frequency of oscillation.

The features of the invention which are believed to be novel are set forth with particularity in the appended claims. The invention itself, however, both as to its organization and method of operation, together with further objects and advantages thereof, may best be understood by reference to the following description when taken in connection with the drawings, wherein:

Figure 1:
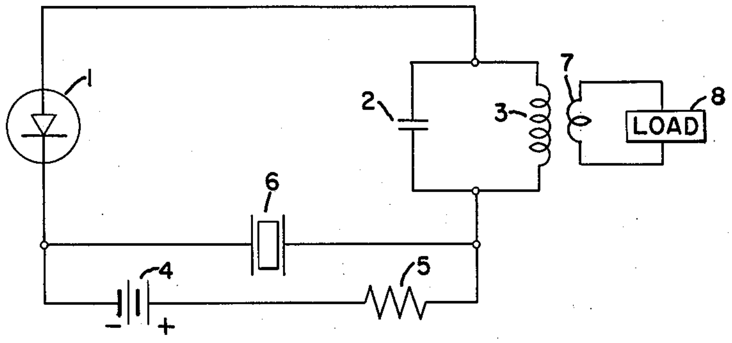
FIGURE 1 illustrates a first embodiment of the invention.

FIGURE 1 is a schematic diagram of an oscillator circuit constructed in accordance with the applicants' invention. The active device utilized is a two terminal semiconductor device 1 having a negative resistance region in the device characteristic. A tank circuit, comprised of a capacitor 2 in parallel with an inductor 3, is connected to one terminal of the semiconductor device 1. A bias supply is connected between the tank circuit and the remaining terminal of the semiconductor device 1 which forwardly biases the semiconductor device 1 into a negative resistance region. The bias circuit is comprised of a D.C. voltage source 4 in series with a bias resistor 5. A piezoelectric crystal 6 having a series resonance mode at the oscillator frequency is connected in shunt with the bias supply. An external load 8, such as an antenna, is inductively coupled to the tank circuit by coil 7.

The operation of the circuit is determined by the relative circuit parameters. The necessary and sufficient conditions for an oscillator utilizing a two terminal negative resistance device to oscillate at a given frequency are:

(1) $$Re(Y) \leqq |-g|$$

(2) $$Im(Y) = 0$$

where $|-g|$ is the magnitude of the negative conductance of the negative resistance device and $Re(Y)$ and $Im(Y)$ are the real and imaginary portions of the admittance of the circuit external to the negative resistance device. It is essential for proper operation that the conditions (1) and (2) for oscillation be met at the desired frequency of oscillation and at no other frequency. For a given circuit, utilizing a semiconductor device having a negative resistance characteristic independent of frequency, the satisfaction of the oscillatory conditions is dependent upon the frequency considered. For the frequency range considered, where the crystal resonances are substantially below the cut off frequency of the device, the reactive components of the impedances of the semiconductor device may be neglected.

Figure 2:
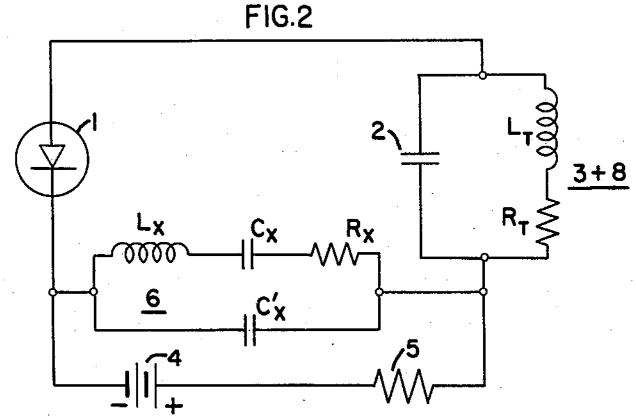
FIGURE 2 is an equivalent circuit of the FIGURE 1 embodiment.

The admittance of the circuit external to the semiconductor device 1 can be seen by inspection of FIGURE 2, wherein the crystal 6 and inductor 3 are represented by their equivalent circuits to be as follows:

(3) $$Y = \frac{Z_X + Z_B}{Z_X Z_T + Z_T Z_B + Z_B Z_X}$$

where the impedances of the various branches are represented by $Z_X$, crystal impedance; $Z_T$, tank circuit impedance; and $Z_B$, bias branch impedance. If the tank circuit is parallel resonant and the crystal is series resonant at the oscillator frequency and the bias resistance is much larger than the resistance of the crystal, the admittance of the circuit becomes a simple expression:

(4)

$$Y = \frac{Z_B}{Z_T Z_B + Z_B Z_X} = \frac{G_T}{(G_T R_X + 1)^2} + j\frac{B_T - G_T^2 X_X}{(G_T R_X + 1)^2}$$

In practice, the conductance of the tank circuit $G_T$ is primarily contributed by the inductor branch. The impedance of the inductor branch is the sum of the inductor impedance and the reflected impedance of the load. Accordingly, the first condition of oscillation is met by adjusting the real part of the impedance of the inductor branch and the resistance of the crystal branch to provide a sufficiently small conductance for the overall external circuit. With the crystal and tank circuit resonant at the desired frequency of oscillation, the second condition, $Im(Y)=0$, is met. Since the tank circuit and crystal will not be resonant at any other frequency simultaneously, no oscillation can be expected at frequencies other than the desired frequency of oscillation because of the second condition for oscillation.

It is essential for an oscillator utilizing a two terminal device having a negative resistance region that the device be properly biased and that the circuit be dynamically stable. These features can be considered in connection with FIGURE 3 in which the D.C. current-voltage characteristic is plotted at 31 for the semiconductor device 1. This device is of the type known as a "tunnel diode." The conventional expression $$g=\frac{dI}{dV}=\frac{1}{r}$$

is used herein for the conductance of the device. The value of the conductance is simply the slope of the characteristic. Accordingly, for positive voltages it varies from a positive value to zero, through a region of negative conductance to zero again, followed by a third and last region of positive slope. The functional dependence of current on voltage is characterized by a single valued relation, the slope of which passes through zero twice but never becomes infinite. This is termed "short circuit stable." Oscillation is permitted, but the device will not switch irreversibly to a steady state condition towards the extremities of the device characteristic.

Figure 3:
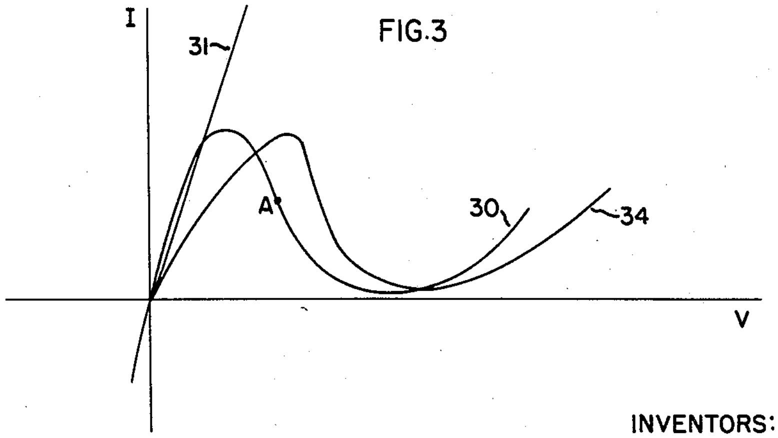
FIGURE 3 is a graph illustrating characteristics of the FIGURE 1 circuit and the semiconductor device.

The line 31 in FIGURE 3 represents a load line. In the circuit of FIGURE 1, the resistance is the sum of the bias resistor 5 and $R_T$, which is the effective A.C. resistance of the inductor branch 6. The overall circuit current-voltage characteristic is shown at 34 in FIGURE 3. The characteristic 34 has a point to point correspondence with the curve 30 wherein the corresponding current for the series circuit is the same amplitude as for the device per se, but obtained at a voltage increased by an amount equal to the IR drop in the series resistor. The resistor 5 is essential to avoid a short circuit through the D.C. voltage source 4 for A.C. signals. This is avoided by selecting a resistor 5 having a magnitude approximately the same as the magnitude of the negative resistance of the device 1. The voltage source 4 is then selected to bias the device 1 into its negative resistance region, preferably the center as at A in FIGURE 3 where the nonlinearity of the device characteristic is a minimum.

As is evident from inspection, when a sufficiently high resistance, greater than $|-r|$, is in series with the negative resistance device, the circuit will no longer be "short circuit stable." That is, the circuit characteristic will become triple-valued for a range of voltages with two points of infinite slope.

In an ideal oscillator, where the circuit resistance is identically equal to the magnitude of the negative resistance, the oscillation will be sinusoidal. Since it is necessary to build up oscillation and to permit the extraction of energy in a practical application, equality is unsatisfactory and some gain must be introduced. However, variation from equality inherently introduces nonlinear effects, primarily harmonics, which must be minimized. Accordingly, the oscillator is designed with minimal variation of the resistance from the magnitude of the negative resistance hence a "soft" oscillation which requires many cycles to build up from a quiescent state, but which closely conforms to the fundamental sinusoidal characteristic.

From the considerations above, it can be seen that a relatively large independence is attained between the A.C. and D.C. circuit properties of the oscillator. The device 1 is biased at point A into its negative resistance region by the bias means comprised of D.C. voltage source 4 and resistor 5. However, the bias means are effectively shunted for A.C. signals at the desired frequency of oscillation. Accordingly, the oscillations are effectively independent of the bias means branch. This enables the frequency stability and the power which is extracted to be maximized. The last two features are not independent. However, it is possible to provide a circuit where substantially all of the A.C. power dissipation is in the external load while retaining very high stability or to obtain ultrahigh frequency stability comparable to any existing oscillators, with a nominal load.

The A.C. impedance of the circuit external to the active device 1 is the sum of the tank circuit impedance and the impedance of the parallel combination of the bias means and the crystal. At the series resonance frequency of the crystal, the imaginary part of the impedance is zero and the real part of the impedance is typically a fraction of the bias resistor. Because of this, the bias means are effectively short circuited at the crystal series resonant frequency and thus provides negligible dissipation to the signal. Since the real part of the impedance of the tank circuit is on the order of ten times that of the crystal, the power dissipation of the circuit is substantially all in the tank circuit, maximizing the available output power and minimizing the losses in the bias means.

As an example of a set of suitable values for the oscillator of FIGURE 1 providing oscillation at 100 mc., the inductance and capacitance of the tank circuit may be $0.5\cdot10^{-6}$ henrys and $5\cdot10^{-12}$ farads for inductor 3 and capacitor 2, respectively. Although lumped circuit elements have been illustrated, it is to be understood that distributed elements may be utilized. A crystal 6 series resonant at 100 mc. with an equivalent series resistance of about 50 ohms and a semiconductor device 1, type 1N2940, having a nominal negative resistance of 150 ohms are suitable. A conventional power supply or battery provide a suitable D.C. voltage source.

The crystal 6 may be a commercially available quartz crystal which is operated at the fundamental series resonance or a harmonic thereof. These crystals have values of Q several orders of magnitude better than lumped constant resonant circuits. If frequency stability requirements can be relaxed, other resonators at their appropriate frequencies such as barium titanates or even a series connected inductor and capacitor can be substituted.

Figure 4:
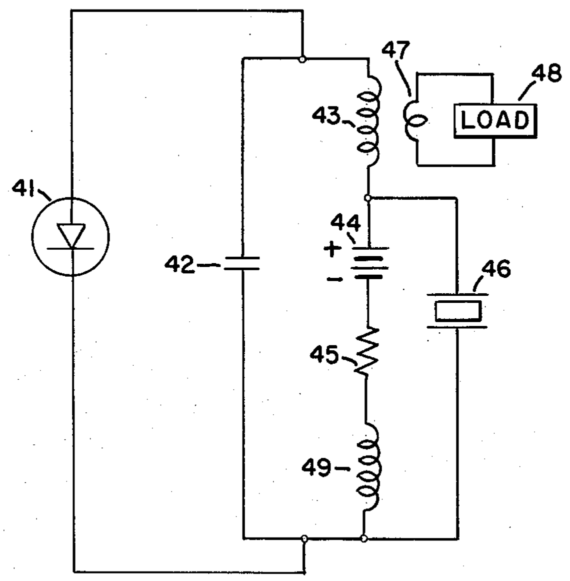
FIGURE 4 illustrates a second embodiment of the invention.

FIGURE 4 is a schematic diagram of an oscillator circuit constructed in accordance with a second embodiment of the applicant's invention. As in FIGURE 1, the active device utilized is a two terminal semiconductor device 41 having a negative resistance region in the device characteristic. A parallel resonant tank circuit is connected across the device 41. A second branch is comprised of an inductor 43 in series with a bias circuit. The bias circuit includes a source of D.C. voltage 44 in series with a bias resistor 45 and an inductor 49. A piezoelectric crystal 46 is connected in shunt across the bias circuit. Coupled inductively to the oscillator circuit by a coil 47 is an external load 48 which may represent an antenna.

The operation of the FIGURE 4 circuit is similar to that of the FIGURE 1 circuit. It is necessary and sufficient that the FIGURE 4 circuit meet the general conditions for oscillation. That is, the real portion of the circuit admittance external to the semiconductor device 41 must be equal to or less than the magnitude of the negative conductance of the semiconductor device and the imaginary portion of the external circuit must be equal to zero. The primary difference between the two illustrated embodiments is that the crystal resonator and the bias means are within the parallel tank circuit in the FIGURE 4 circuit. They are placed in the inductor branch of the tank circuit. Accordingly, the real portion of the resultant impedance is added to the real portion of the impedance of that branch. The inductively coupled load 48 contributes a significant portion of the admittance of the circuit. This contribution may be treated as a reflected impedance which is added to the impedance of inductor 43. The effect is that the inductance is increased and a substantial contribution to the real impedance is made.

As is well known, the semiconductor device 41 will have parasitic reactances. However, these reactances are normally insignificant at frequencies where the crystal has substantial response. When operation at very high frequency is desired, these parasitic reactances should be combined with the external circuit in determining design values.

If the parallel reactance contributed by the holder capacitance of the crystal 46 becomes significant at the higher frequencies, it is necessary to eliminate this effect. The inductor 49 is inserted in series with resistor 45 for this purpose. The value of the reactance of the inductor 49 is selected to cancel the crystal parallel capacitance.

It is to be understood that the invention is not to be considered limited to the specific embodiments described. The true scope of the invention, including those variations apparent to one skilled in the art, is defined in the following claims.

What is claimed is:

1. A frequency controlled oscillator comprising: a tunnel diode; a resonant network connected across said diode; bias means for said tunnel diode including a resistor and a voltage source connected in series for biasing said diode in the negative resistance region, said resonant network including a parallel resonant loop from which power output is derived; and a series resonant element, said series resonant element shunting said bias means to minimize A.C. dissipation in said resistor.

2. A frequency controlled oscillator comprising: a low power two terminal semiconductor device having a characteristic with a region of negative resistance in the forward direction of bias; an inductor; bias means, said device, inductor and bias means being connected as a series circuit loop; said bias means being comprised of a D.C. voltage source and a series resistor circuit selected to bias the semiconductor device into a region of negative resistance; a capacitor connected in parallel with said inductor and having a reactance such as to provide parallel resonance at the desired frequency of oscillation; and a resonator, series resonant at the desired frequency of oscillation, connected in shunt with said bias means.

3. The frequency controlled oscillator of claim 2 further comprising: a load inductively coupled to said inductor.

4. A frequency controlled oscillator comprising: a tunnel diode; a parallel resonant circuit; bias means including a series connected resistor and a voltage source for biasing said diode in the negative resistance region, all connected in series to form a first loop; and a series resonant circuit shunting said bias means.

5. A frequency controlled oscillator comprising: a two terminal tunnel diode having a region of negative resistance in the forward direction of bias; a source of voltage connected in series with said diode for biasing said diode for operation in the region of negative resistance; a resistor connected in series with said diode and said source of voltage; a parallel tank circuit resonant at the desired oscillation frequency, said tank circuit being connected across said series connected diode, source of voltage, and resistor; and a piezoelectric resonator connected in shunt with said series connected source of voltage and resistor, said resonator being selected to have a series resonance frequency at the desired frequency of oscillation.

6. A frequency controlled oscillator comprising: a two terminal semiconductor diode having a characteristic with a region of negative resistance in the forward direction of bias; a parallel resonant circuit connected across said diode, said tank circuit including a first branch comprised of a capacitor and a second branch comprised of an inductor providing parallel resonance with said capacitor at the desired frequency of oscillation, said second branch further including a source of voltage and a bias resistor connected in series with said inductor and a piezoelectric resonator connected in shunt across said source of voltage and said bias resistor and having a series resonance frequency at the desired frequency of oscillation.

References Cited in the file of this patent

UNITED STATES PATENTS 2,332,102 Mason ---------------- Oct. 19, 1943